(12) United States Patent
Ricci

(10) Patent No.: US 9,018,965 B2
(45) Date of Patent: Apr. 28, 2015

(54) METHOD AND SYSTEM TO VERIFY THE RELIABILITY OF ELECTRONIC DEVICES

(75) Inventor: Raffaele Ricci, Pregnana Milanese (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 604 days.

(21) Appl. No.: 13/142,528

(22) PCT Filed: Nov. 26, 2009

(86) PCT No.: PCT/IB2009/055359
§ 371 (c)(1),
(2), (4) Date: Jun. 28, 2011

(87) PCT Pub. No.: WO2010/076687
PCT Pub. Date: Jul. 8, 2010

(65) Prior Publication Data
US 2011/0267081 A1 Nov. 3, 2011

(30) Foreign Application Priority Data
Dec. 29, 2008 (IT) .............. TO2008A0994

(51) Int. Cl.
*G01R 31/00* (2006.01)
*G01R 31/28* (2006.01)

(52) U.S. Cl.
CPC .......... *G01R 31/002* (2013.01); *G01R 31/2849* (2013.01)

(58) Field of Classification Search
CPC .......... G01R 31/318508; G01R 31/10; G01R 31/2817; G01R 31/2849; G01R 31/2855
USPC ............. 324/110, 452, 527, 555, 600, 72, 324/750.05–750.07, 537, 750.01, 754.19, 324/762.01, 762.02; 702/57–58, 124; 361/56
See application file for complete search history.

(56) References Cited

U.S. PATENT DOCUMENTS 5,132,612 A 7/1992 Burns et al. ................ 324/158
(Continued)

OTHER PUBLICATIONS

ADI Reliability Handbook, Analog Devices, Inc., 2000, pp. 1-22.
(Continued)

*Primary Examiner* — Tung X Nguyen
*Assistant Examiner* — Son Le
(74) *Attorney, Agent, or Firm* — Allen, Dyer, Doppelt, Milbrath & Gilchrist, P.A.

(57) ABSTRACT

To verify robustness with respect to electrical overstresses of an electronic circuit under test, the latter is exposed to electrical overstresses, and the behavior thereof is monitored. In particular, both the testing of the electronic circuit in dynamic conditions is performed by causing it to be traversed by the currents that characterize operation thereof, and by exposing at least one supply line of the electronic circuit under test to electrical overstresses and the testing of the electronic circuit under test in static conditions, without causing it to be traversed by the currents that characterize operation thereof, and by exposing to electrical overstresses both the supply and the input and/or output lines of the electronic circuit under test. The device for generating the overstresses can be mounted on a circuit board, which can be coupled as daughter board to a mother board, on which the electronic circuit under test is mounted.

11 Claims, 3 Drawing Sheets

(56) References Cited

U.S. PATENT DOCUMENTS

| | | | |
|---|---|---|---|
| 6,057,698 A * | 5/2000 | Heo et al. | 324/750.03 |
| 2003/0101016 A1 * | 5/2003 | Kumar et al. | 702/124 |
| 2005/0017745 A1 | 1/2005 | Ito | 324/761 |
| 2005/0146337 A1 * | 7/2005 | Matsunaga et al. | 324/751 |
| 2007/0018670 A1 | 1/2007 | Ito et al. | 324/765 |

OTHER PUBLICATIONS

Diaz, "Automation of electrical overstress characterization for semiconductor devices", Hewlett-Packard Journal, Oct. 1994, No. 5, pp. 106-111.

Satoh, "Improvement of degradation detection in ESD test for semiconductor products", ITES Co., Ltd., IEEE, 2002, pp. 1047-1051.

* cited by examiner

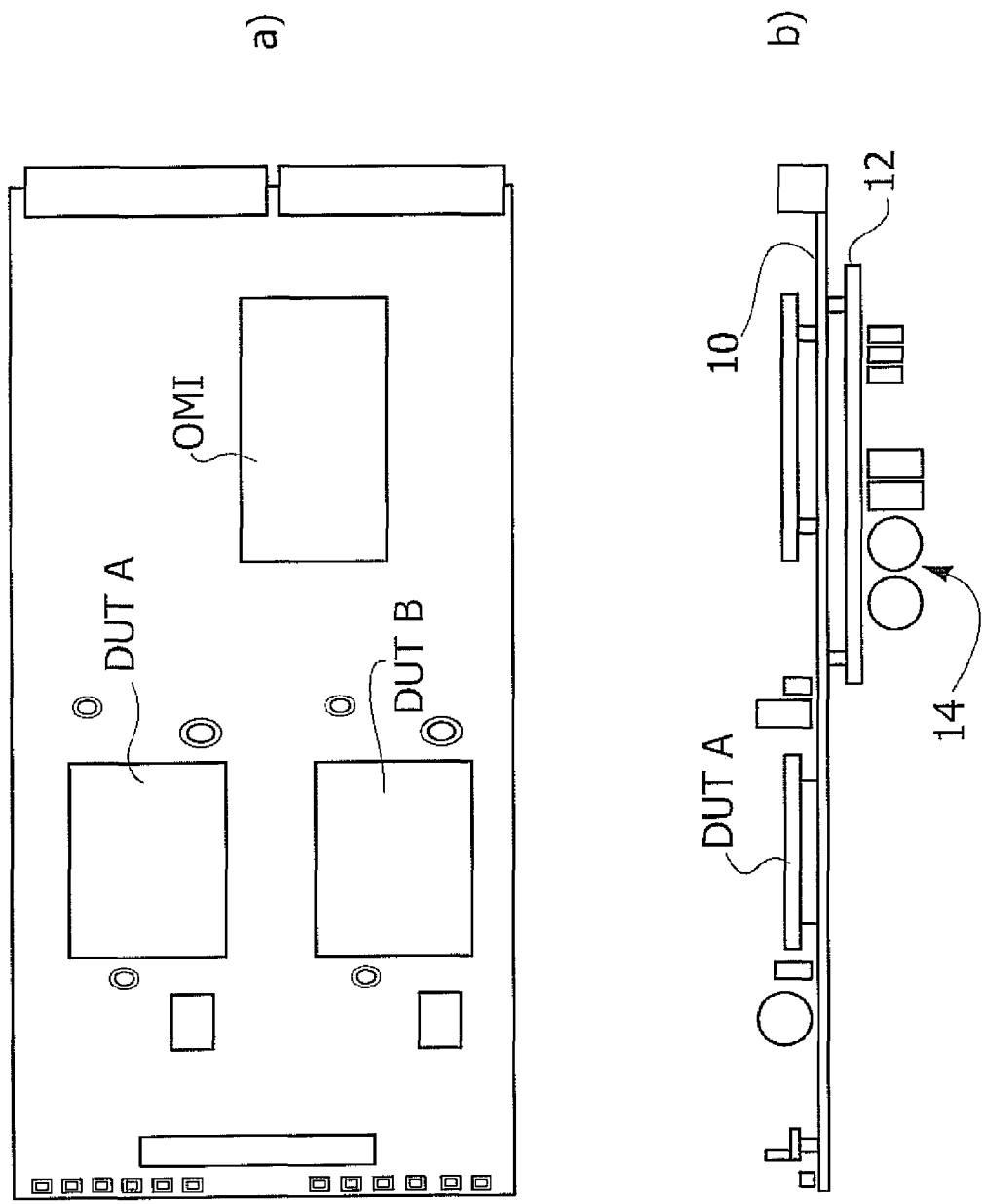

METHOD AND SYSTEM TO VERIFY THE RELIABILITY OF ELECTRONIC DEVICES

FIELD OF THE INVENTION

The present description relates to techniques for verifying the reliability of electronic devices.

Specifically, this description relates to verification of the robustness of electronic devices with respect to electrical stresses induced by system transients that can arise during operation of the device.

BACKGROUND OF THE INVENTION

Electrical over stresses (EOSs) are a constant cause of failure for integrated circuits. According to certain reports, approximately 40% of the failures found in integrated circuits can be attributed to EOS phenomena or events.

In particular, for semiconductor devices, EOS events comprise a wide range of stresses of an electrical nature, due, for example, to electro-magnetic pulses (EMPs), system transients of various nature (the so-called "overvoltage spikes" on the supply lines and input/output lines) and electro-static discharge (ESD). In particular, events belonging to the latter type of EOS have durations of between 1 ns and 1 μs, and occur prevalently in the production and handling stages, i.e., when the device is not subject to electrical biasing.

The failures linked to EOS events in semiconductor devices can be classified according to the respective primary failure mechanism: failures induced as a result of thermal or electrical effects (phenomena of thermomigration or electromigration of material, which involve the metallization layers), phenomena of latch-up, breakdown of the gate oxide, and other failures that can be correlated to electrical fields.

The EOS events considered herein belong to the family of system transients (on the supply lines and input/output lines). For these events, the sensitivity as a function of temperature depends upon the failure mode considered. For example, it is minimal for (thermo-electrical) damage of the metallizations and very serious for breakdown of the oxides.

These particular events can be defined as overvoltage or overcurrent phenomena which have a duration of between 1 μs and 1 ms, and which occur during operation of the device.

"Automation of electrical overstress characterization for semiconductor devices", Diaz C. H., Hewlett-Packard Journal, Hewlett-Packard Co. Palo Alto Calif., US, vol. 45 no. 5, pages 106-111, describes an automatic test system developed to characterize semiconductor devices and interconnect failures caused by electrical overstress. Electrical stress in the form of current pulses of increasing amplitude is applied to a device under test in the testing mode. The test system was developed for monitoring EOS robustness in advanced CMOS processors under test.

"EOS/EDS; ADI Reliability Handbook", 2000 Analog Devices Inc. Norwood, Mass. 02062, pages 1-22, describes Human Body Model and Machine Model test methods that simulates the application of EOS on ICs.

US 2007/0018670 A1 describes a system and method for electrostatic discharge (ESD) testing. The system includes a circuit that has a switch coupled to an input/output (I/O) circuit of a device under test (DUT), a charge source coupled to the switch, and a control circuit coupled to the switch. The control circuit turns on the switch to discharge an ESD current from the charge source to the I/O circuit, and the circuit is integrated into the DUT. The system provides on-chip ESD testing of a DUT without requiring expensive and specialized test equipment.

"Improvement of degradation detection in ESD test for semiconductor device", Satoh S ED—Institute of Electrical and Electronics Engineers, conference record of the 2002 IEEE Industry applications conference 37th IAS annual meeting, Pittsburgh, Pa., Oct. 13-18, 2002 describes ESD test as evaluation tests for semiconductor products. In particular, the most popular and standardized test is the Human Body Model ESD test. In HBM ESD test some issues are experienced in the detection of device degradation as pass/fail judgment after ESD stress applied. Some kind of device degradation cannot be detected with the conventional test condition and criteria. Improved judgment test using effective combination of optimized DC leak test and device functional test was proposed.

US 2005/017745 A1 describes an electrostatic withstand voltage test method that enables semiconductor integrated circuit testing to be performed with a high degree of precision and at low cost. In this method, with one of ground pins VSS and VSSI of a semiconductor integrated circuit grounded, static electricity is applied from a static electricity discharge apparatus to all pins of semiconductor integrated circuit, after which, with power supply apparatus connected to power supply pin VDD of semiconductor integrated circuit and the other grounded, a leakage current test apparatus is connected to all signal pins and pin leakage current is tested, and with ground pin VSSI of the internal circuitry of semiconductor integrated circuit grounded and leakage current test apparatus connected to power supply pin VDDI, a pattern generator that supplies a digital signal is connected to signal input pins (IN, I/O), and power supply leakage current is tested.

U.S. Pat. No. 5,132,612 describes an apparatus for applying high current fast rise time pulses simulating electrostatic discharge (ESD) to various combinations of pins of a device under test (e.g., a microcircuit). The apparatus also provides for testing of the DUT after the performance of ESD stress testing. The apparatus establishes electrical connections between the terminals of a high voltage pulse generator (HVPG) and several different combinations of the DUT pins in sequence in order to apply ESD stresses. The apparatus further provides functional parameter tests whether the connection to the DUT pins during ESD stressing has caused the DUT to fail.

Further advances in testing the performance of electronic devices in the presence of electrical overstresses are, however, needed.

SUMMARY OF THE INVENTION

On the basis of the state of the art outlined above, there is the need to have available methods that enable evaluation of the robustness/sensitivity of electronic devices, such as integrated circuits, with respect to system transients (EOS) that occur during normal operation.

This need is felt, in particular, for devices obtained using BCD (Bipolar CMOS DMOS) technology; these devices are more sensitive to the events than, for example, system-on-chip (SOC) devices as a result of the differences in operation. Normally, in fact, BCD devices directly interface with inductive loads, which notoriously generate spikes.

An embodiment described herein envisages that a generator of stresses of a system transient type (SOS) is able to apply positive and negative EOS system transient stresses on the input-output (I/O) terminals of the Device Under Test (DUT), including the supply lines both in static conditions and in dynamic conditions.

An embodiment described herein is able to perform the verification outlined previously by taking into account the operational conditions of the device (both static and dynamic) and to perform an action of verification with respect to system transients of an EOS type applied in dynamic conditions. (i.e., with devices under test (DUTs) that are fully operative, with the possibility of control in current of ohmic-inductive loads), and in static conditions. (i.e., with electrically biased devices in a wait state or in standby state and not traversed by high currents).

An embodiment is able to operate in dynamic conditions (i.e., with the device functioning), for example in HTOL (High-Temperature Operating Life) conditions, with the alternative application of positive stresses to just the terminals of the supply lines.

BRIEF DESCRIPTION OF THE DRAWINGS

The invention will now be described, purely by way of non-limiting example, with reference to the annexed drawings, in which:

FIG. 1A is a top view of a system for conducting HTOL reliability tests on an electronic device, in accordance with the present invention.

FIG. 1B is a side view of the system of FIG. 1A.

DETAILED DESCRIPTION OF THE PREFERRED EMBODIMENTS

In the ensuing description, various specific items are illustrated aimed at providing a deep understanding of the embodiments. The embodiments can be obtained without one or more of the specific items, or with other methods, components, materials, etc. In other cases, known structures, materials or operations are not illustrated or described in detail in order not to obscure the various aspects of the embodiments.

The reference to "one embodiment" in the scope of this description is intended to indicate that a particular configuration, structure or characteristic described in relation to the embodiment is present in at least one embodiment. Hence, phrases such as "in one embodiment", present in different points of this description, do not necessarily refer to the same embodiment. Furthermore, particular conformations, structures or characteristics can be combined in any adequate way in one or more embodiments. The references used herein are only for reasons of convenience and hence do not define the sphere of protection or the scope of the embodiments.

FIGS. 1A and 1B represents, respectively in plan view and in a vertical median section, a mother board 10 that can be used for conducting reliability tests of an HTOL type on one or more electronic devices under test (DUTs).

This embodiment includes a mother board 10 that can be used for testing two devices alternatively, designated by DUT A and DUT B.

Also visible in FIG. 1 is the OMI (OLT Module Interface) that communicates with the testing apparatus of which the mother board 10 forms part.

In the specific case of FIG. 1, the device for conducting EOS tests comprises a daughter board 12 that can be coupled to the mother board 10. Mounted on the daughter board 12 is a set of circuits 14, designed to generate pulses that simulate EOS system transient events according to the modalities described more fully in what follows.

The circuits 14 are configured typically as oscillator circuits that can generate pulses having the characteristics described more fully in what follows.

As may be seen more clearly in FIG. 1B, the daughter board 12 is coupled to the mother board 10 on the face opposite to the face on which the devices under test OUT A and DUT B and the interface OMI are mounted.

This arrangement enables a dual advantage to be achieved. In the first place, no appreciable modification of the mother board 10 is necessary; moreover, the mother board 10 and the EOS daughter board 12 can be located directly in the testing apparatus.

Figure 2:
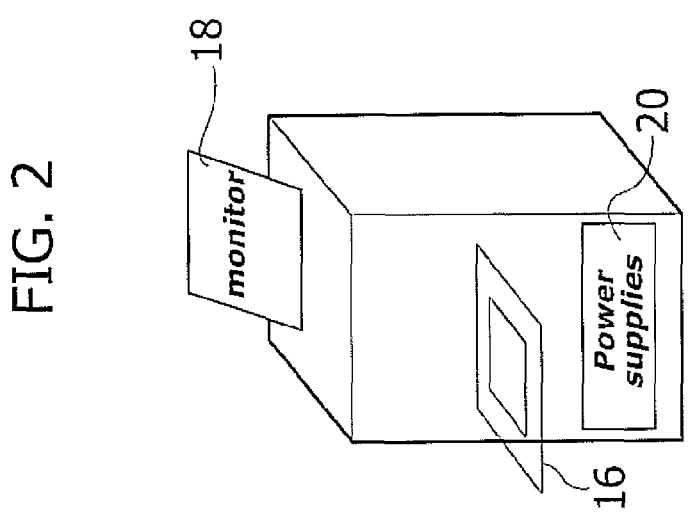
FIG. 2 is a perspective block diagram of a system for conducting electrical over stress tests on an electronic surface, in accordance with the present invention.

FIG. 2 illustrates schematically the EOS test board configured as a stand-alone board 16 within a dedicated apparatus including a monitor 18 that can be managed by a personal computer integrated in the system. FIG. 2 highlights the presence of the supply sources 20, with the consequent possibility of applying EOS events also to the supply sources.

Figure 3:
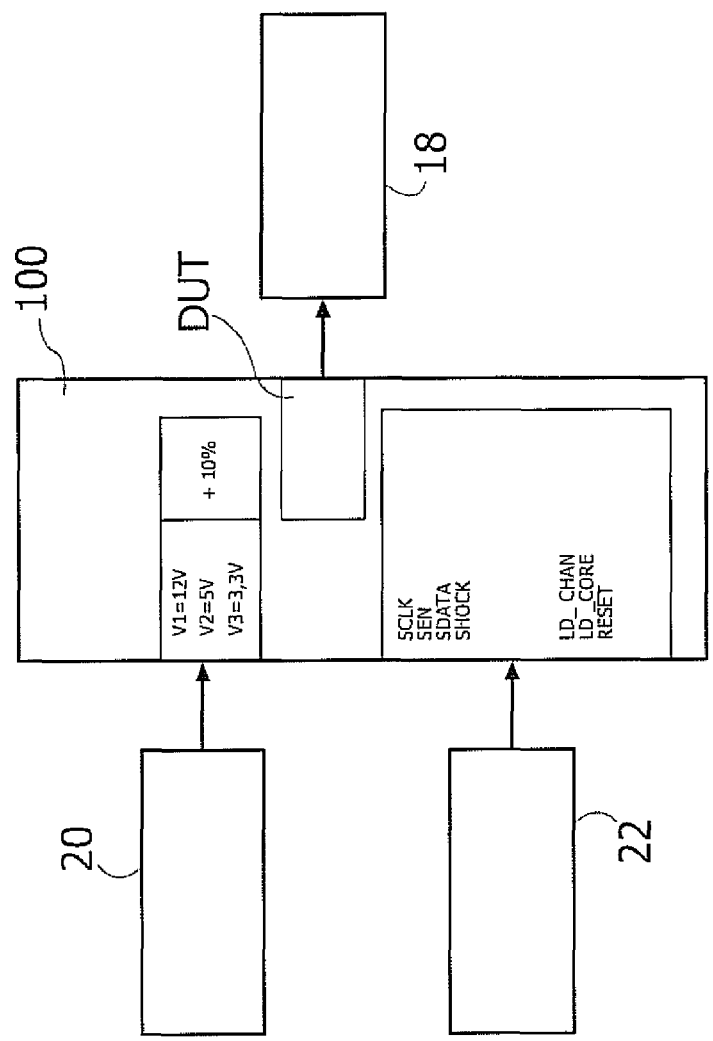
FIG. 3 is as more detailed block diagram of the system of FIG. 2.

FIG. 3 highlights the possibility of using the system described herein within a testing apparatus 100.

Highlighted schematically in FIG. 3 is the presence of the device under test, to which—in a normal test cycle—"stimuli" of various nature are applied for the operation of the DUT. The monitor 18 is used as a terminal of a personal computer (programming of the stimulation pattern and data collection).

In the embodiment illustrated herein, there is moreover envisaged the possibility of intervening on the supply lines 20 (for example, 12 V, 5 V, 3.3 V nominal) applying thereto—in dynamic conditions, i.e., whilst the DUT is being tested in operating conditions—system transients (EOSs). Added to this is the possibility of observing/recording on the monitor 18 the outcomes produced by the EOSs on the device.

The evaluation of the robustness of the DUT will be obtained based upon a definitive parametric control by means of ATE (Automatic Testing Equipment) at the end of the EOS stimulations.

The methods described herein hence enable the DUT (typically an integrated circuit) to be subjected to stresses of an EOS system transient type during normal operation (i.e., while the circuits are handling currents), i.e., while the mother board is operating in a normal HTOL configuration.

The EOS events can be applied in a way that is synchronous or asynchronous with respect to the pattern of stimulation of the DUT 22, with the added possibility of programming both the amplitude and the pulse widths.

Figure 4:
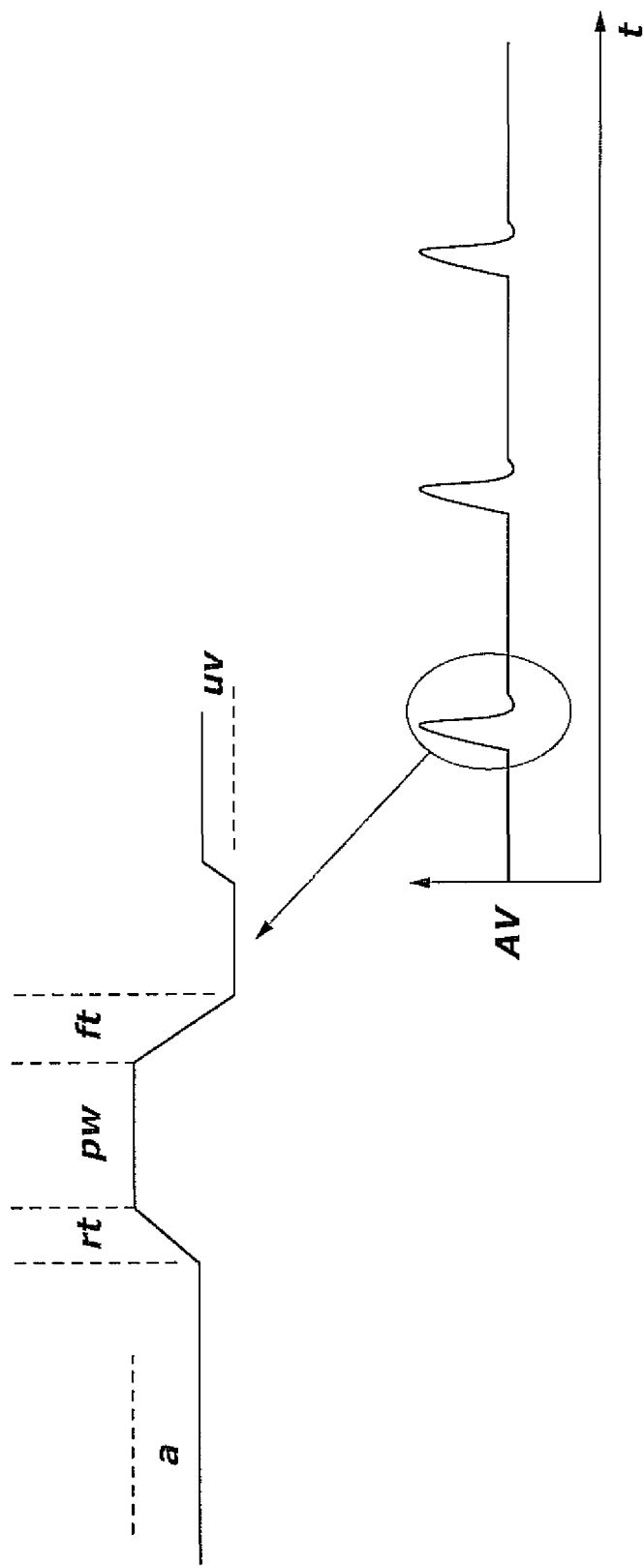
FIG. 4 illustrates waveforms that can be applied to the devices under test using the system of FIGS. 1A-3.

For example, the diagram of FIG. 4 shows the plot of a pulse train (bottom right part of FIG. 4), the characteristics of which can be partially set, in particular with respect to the following characteristics:

absolute amplitude a—settable;
    rise time rt—in itself not settable, but a consequence of the amplitude a;
    pulse width pw—settable;
    fall time ft—in itself not settable, but a consequence of the amplitude a;
    overshoot voltage (negative) uv—in itself not settable, but a consequence of the amplitude a.

For example, the amplitude a can reach a value of 27 V with a rise time (rt) and fall time (ft) having a typical value of 5 µs. Furthermore, for example, the pulse width pw is programmable from 10 µs to 470 µs, and the negative voltage uv can reach a value of 10% of the maximum value of the pulse set. The pulse-repetition time can be set with a minimum of approximately 1 s.

The aforesaid values are of course to be understood purely as an example and are not to be read in a sense that might in any way limit the scope of the present description. Similar considerations apply to the values exemplified in the tables reproduced below.

The ensuing table makes reference to EOS events that can be applied on three DC voltages V1, V2, and V3—representing three supply voltages (for example, the voltages 20 of FIG. 3).

| Voltage range | Min. | Max. |
|---|---|---|
| DC voltage V1 | 5 V<br>(min. spike 7 V)<br>(max. spike 22 V) | 20 V<br>(max. spike 7 V)<br>(min. spike 0 V) |
| DC voltage V2 | 3 V<br>(min. spike 3 V)<br>(max. spike 7 V) | 8 V<br>(max. spike 2 V)<br>(min. spike 0 V) |
| DC voltage V3 | 3 V<br>(min. spike 1 V)<br>(max. spike 7 V) | 8 V<br>(max. spike 2 V)<br>(min. spike 0 V) |

The next table relates to programmable spikes that can be superimposed on the aforesaid voltages V1, V2, V3.

|  | V1 Min.; Max.. | V2 Min.; Max. | V3 Min.; Max. |
|---|---|---|---|
| Programmable spikes (absolute voltage amplitude) | 12 V; 27 V | 6 V; 10 V | 4 V; 10 V |

During operation as a generator of EOSs of a static type (i.e., for verifying the behavior of a device with an integrated circuit when exposed to sudden spikes applied on the supply lines), the system described herein envisages that the circuit under test, or DUT, is biased without being traversed by the currents that characterize operation thereof with the application of spikes one at a time.

During static operation, the device described herein enables production of EOS system-transient events in an asynchronous way, with there not being a stimulation pattern.

The EOS events can be applied on as many as three supply lines and/or on all the inputs and outputs (both positive and negative). Both the amplitude and the duration of the spikes are programmable (in a single or multiple way).

In a possible experimental configuration, the embodiment to which FIG. 3 refers has been used for applying EOS events to an integrated circuit with two supply lines V1 and V2 with nominal values equal to 13.2 and 5.5 V, respectively.

The system described herein enables validation, from the point of view of the designer, of the circuit protection adopted in the integrated circuit DUT with respect to the EOS system transients, with the possibility of seeking the limits or margins of application with respect to the EOS events. The system described herein can also be included in a program of control of production in real time (RTC—Real Time Control) with the possibility of intervening during verification on the production lots of the product itself.

Embodiments of the system described herein envisage the implementation of the stresses in static conditions, i.e., with the device biased, without the latter being traversed by the currents that characterize operation thereof, for example in HTRB (High-Temperature Reverse Bias) conditions, with the application of positive and/or negative stresses on the I/O terminals and on the terminals of the supply lines.

Embodiments of the system described herein envisage implementation of the stress in dynamic conditions (i.e., with the device functioning), for example in HTOL conditions, with application of the positive and/or negative stresses both on the terminals of the supply lines and on the I/O terminals, alternatively.

Embodiments of the system described herein can involve extension of the number of supplies of the DUT on which to apply the EOS system transients, one at a time, and/or increase in the maximum nominal value of the voltage of the DUT, for example, to +60 V.

For example, the maximum amplitude of the positive voltage applied to the DUT can be +100 V (maximum nominal value +60 V plus EOS spike), with a maximum amplitude of the negative voltage applied to the DUT of −60 V (nominal value minus EOS spike).

Other possible values are the following:
  max. undervoltage: 10%;
  typical rise and fall slew rate: 2 µs;
  time durations of the pulses that can be applied to the supply voltages: from a minimum of 5 µs to a maximum of 200 µs; and
  time durations of the pulses that can be applied to the I/O terminals: from a minimum of 5 µs to a maximum of 500 µs.

In one embodiment, the electrical circuits for stimulation of the EOS system-transient events are integrated in a specific board and are independent of the type of the DUT.

In one embodiment, the specific configuration of HTOL mode of the DUT can be integrated in a mother board dedicated to the functionality of the DUT.

In one embodiment, the EOS system transients can be applied to the DUT, both to the I/O terminals and to the supply lines in an alternative way in both static configuration and dynamic configuration, as described previously.

One embodiment uses a personal computer for acquisition and management of the data of the OUT, detecting operation thereof in real time.

It follows that, without prejudice to the principle of the invention, the details of construction and the embodiments may vary, even significantly, with respect to what is described and illustrated herein purely by way of non-limiting example, without thereby departing from the scope of the invention, as defined by the annexed claims.

That which is claimed is:

1. A method of testing an electronic circuit comprising:
  operating the electronic circuit while exposing the electronic circuit to electrical overstresses;
  generating the electrical overstresses as an electrical pulse train, with amplitudes, durations, pulse widths, pulse train frequency, and overshoot voltages of the electrical pulse train being settable in real time;
  simultaneously superimposing the electrical overstresses on a plurality of different supply voltages of the electronic circuit, each supply voltage being subject to a respective electrical overstress different from the electrical overstress superimposed on other supply voltages; and
  monitoring operation of the electronic circuit after exposure to the electrical overstresses.

2. The method of claim 1, wherein exposing the electronic circuit to the electrical overstresses comprises exposing at least one of the plurality of different supply voltages and an input/output line of the electronic circuit to the electrical overstresses.

3. The method of claim 1, further comprising synchronously applying test stimuli to the electronic circuit while exposing the electronic circuit to the electrical overstresses.

4. The method of claim 1, further comprising asynchronously applying test stimuli to the electronic circuit while exposing the electronic circuit to the electrical overstresses.

5. A method of testing an electronic circuit comprising:
operating the electronic circuit while exposing a plurality of different supply voltages and an input/output line thereof to electrical overstresses by simultaneously superimposing the electrical overstresses on the plurality of different supply voltages and the input/output line of the electronic circuit in real time, each supply voltage being subject to a respective electrical overstress different from the electrical overstress superimposed on other supply voltages; and
monitoring operation of the electronic circuit after exposure to the electrical overstresses;
the electrical overstresses comprising an electrical pulse train having a settable amplitude, a settable duration, a settable pulse width, a pulse train frequency, and a settable overshoot voltage.

6. The method of claim 5, further comprising synchronously applying test stimuli to the electronic circuit while exposing the electronic circuit to the electrical overstresses.

7. The method of claim 5, further comprising asynchronously applying test stimuli to the electronic circuit while exposing the electronic circuit to the electrical overstresses.

8. A system for testing an electronic circuit comprising:
a motherboard to be coupled to the electronic circuit;
a daughterboard to be coupled to the motherboard and configured to
set amplitudes, durations, pulse widths, pulse train frequencies, and overshoot voltages of an electrical pulse train in real time, and
expose the electronic circuit to electrical overstresses while the electronic circuit is operating by simultaneously superimposing the electric pulse train on a plurality of different supply voltages of the electronic circuit, each supply voltage being subject to a respective electrical overstress different from the electrical overstress superimposed on other supply voltages; and
a circuit monitor configured to monitor operation of the electronic circuit after exposure thereof to the electrical overstresses.

9. The system claim 8, wherein the electronic circuit has an input/output line; and wherein the daughterboard is configured to expose the electronic circuit to the electrical overstresses by exposing at least one of the plurality of different supply voltages and the input/output line to the electrical overstresses.

10. The system of claim 8, wherein the motherboard is configured to synchronously apply test stimuli to the electronic circuit while the daughter board exposes the electronic circuit to the electrical overstresses.

11. The system of claim 8, wherein the motherboard is configured to asynchronously apply test stimuli to the electronic circuit while the daughter board exposes the electronic circuit to the electrical overstresses.

* * * * *